(12) United States Patent
Sakamoto et al.

(10) Patent No.: US 7,072,224 B2
(45) Date of Patent: Jul. 4, 2006

(54) NONVOLATILE MEMORY AND METHOD OF ERASING FOR NONVOLATILE MEMORY

(75) Inventors: Yoshinori Sakamoto, Hitachinaka (JP); Tatsuya Bando, Fussa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/284,949

(22) Filed: Nov. 23, 2005

(65) Prior Publication Data

US 2006/0077718 A1  Apr. 13, 2006

Related U.S. Application Data

(63) Continuation of application No. 10/700,592, filed on Nov. 5, 2003.

(30) Foreign Application Priority Data

Nov. 20, 2002  (JP) .............................. 2002-337111

(51) Int. Cl.
 *G11C 11/34* (2006.01)
(52) U.S. Cl. ............................. 365/185.27; 365/185.29
(58) Field of Classification Search ........... 365/185.27, 365/185.29
See application file for complete search history.

(56) References Cited

U.S. PATENT DOCUMENTS

| 4,673,829 | A |  | 6/1987 | Gupta ........................ 307/296 |
|---|---|---|---|---|
| 4,775,958 | A |  | 10/1988 | Hashimoto ................ 365/185.2 |
| 4,794,564 | A |  | 12/1988 | Watanabe ............... 365/185.22 |
| 5,077,691 | A |  | 12/1991 | Haddad et al. ......... 365/185.23 |
| 5,218,569 | A | * | 6/1993 | Banks .................... 365/185.21 |
| 5,297,095 | A | * | 3/1994 | Sato et al. .............. 365/185.22 |
| 5,959,882 | A |  | 9/1999 | Yoshida et al. ......... 365/185.03 |
| 6,442,075 | B1 |  | 8/2002 | Hirano ................... 365/185.29 |
| 6,490,201 | B1 |  | 12/2002 | Sakamoto .............. 365/185.22 |
| 2004/0213049 | A9 | * | 10/2004 | Guterman et al. ...... 365/185.28 |

FOREIGN PATENT DOCUMENTS

| JP |  | 10-027486 | 1/1998 |
|---|---|---|---|
| JP |  | 2002-109891 | 4/2002 |

\* cited by examiner

*Primary Examiner*—Michael Tran
(74) *Attorney, Agent, or Firm*—Miles & Stockbridge P.C.

(57) ABSTRACT

The number of rewrites for memory cells is to be increased, and the reliability of data reading to be substantially improved. Where data in memory cells are to be erased, the switching of an erase voltage to be applied to the control gate of each memory cell, while switching from one to another of voltages of any different levels, as the control gate voltage (=soft erase voltage) is accomplished according to the quantity of electric charges accumulated at the floating gate of each memory cell so as to keep substantially constant the voltage applied to the tunnel film of the memory cell. Upon acceptance of an erase command, a CPU supplies a control signal to a decoder, and on the basis of the resultant decode signal an erase voltage switching circuit generates a soft erase voltage of a certain level. After that, while switching from one to another of soft erase voltages differing in level, data in the memory cell are erased. Upon completion of erasing data in the memory cell, erase verification is carried out.

4 Claims, 15 Drawing Sheets

$Cr = C2/(C1+C2)$
$Cd = C3/(C1+C2)$  $Cs = C4/(C1+C2)$
$Vfg = Cr \cdot (Vcg - Vth + Vthi) + Cd \cdot Vd + Cs \cdot Vs$
NOTE) $Vcg = Vword - Vwell$
ELECTRICAL FIELD OF INTER-LAYER FILM $= Vcg - Vfg$
$Vthi = Vth$ IN THERMALLY EQUILIBRATED STATE

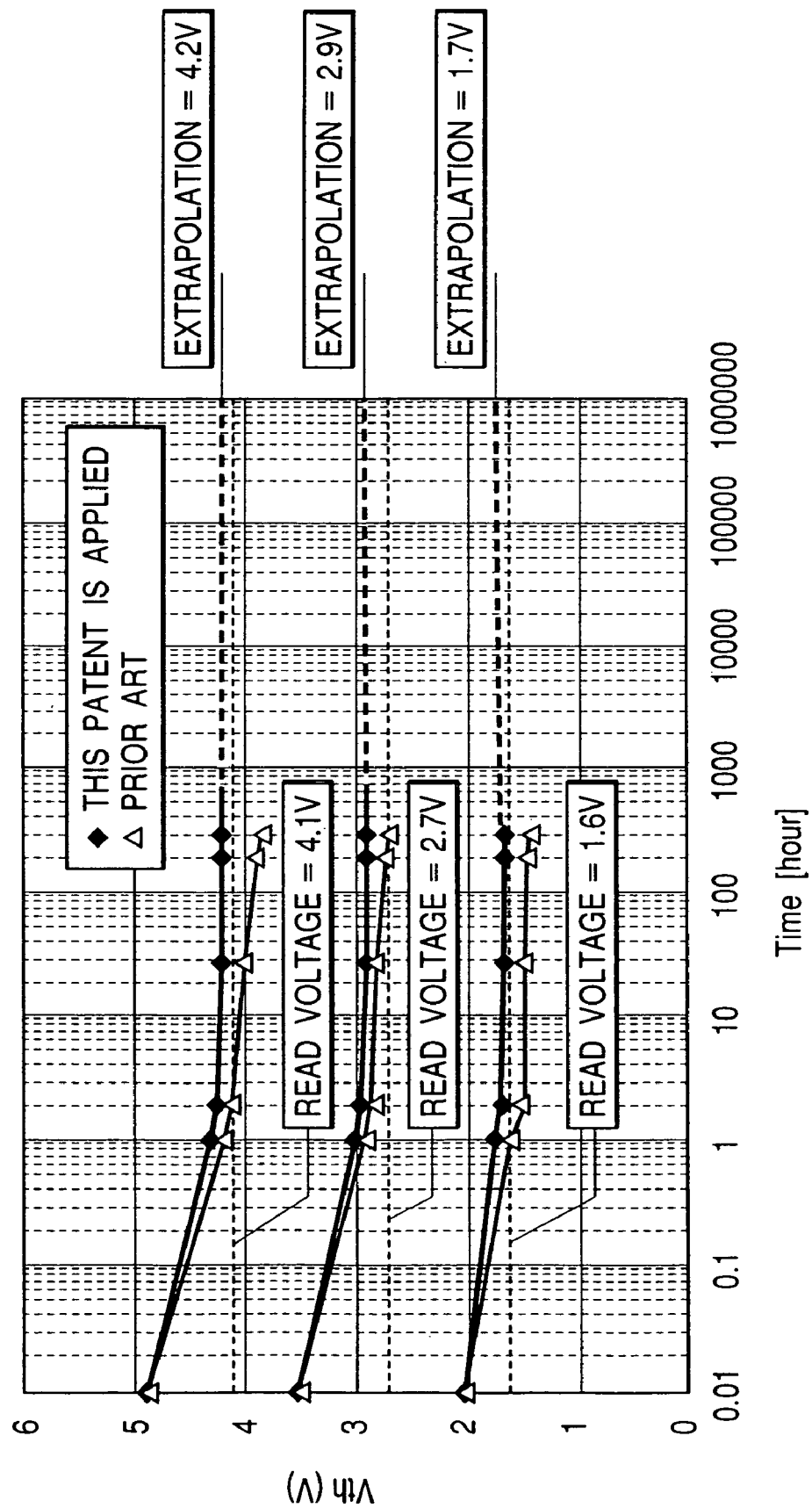

NONVOLATILE MEMORY AND METHOD OF ERASING FOR NONVOLATILE MEMORY

CROSS-REFERENCE TO RELATED APPLICATION

This application is a continuation of Application Ser. No. 10/700,592 filed Nov. 5, 2003.

BACKGROUND OF THE INVENTION

The present invention relates to a technique for improving the reliability of nonvolatile memories, and more particularly to a technique that can be effectively applied to reducing damage to memory cells when erasing data therein.

In recent years, along with the increasingly widespread use of mobile devices including mobile telephones above all, the requirements for larger data capacities and reduced costs are becoming more stringent at a rapid pace. One of the known techniques to meet this new requirement for larger capacities is a multiple value storage technique by which a plurality of threshold voltage levels are set for each memory cell and data of two bits or more each are stored, embodied in multiple value flash memories.

The present inventors applied for a patent regarding operations to write into a multiple value flash memory, identified as the Japanese Unexamined Patent Publication No. 2002-109891 (Patent Reference 1). In this application, the inventors describe a technique by which, in writing into a flash memory, a voltage pulse of a short duration is applied to the control gate of a memory cell in an erased state a plurality of times as the write voltage pulse to be first applied to the memory cell in order to prevent the phenomenon of accidental excess writing (erratic error).

It has been found that the erratic error phenomenon more frequently occurs when a write voltage pulse is first written into a memory cell in an erased state. This means that, by shortening the duration of the write voltage pulse first applied to a memory cell in an erased state, it is made possible to reduce the electric charge accumulated in the charge accumulation area of the memory cell by an FN tunnel phenomenon resulting from a high electrical field applied between the channel area and the control gate of the memory cell, and thereby to prevent a substantial variation in threshold voltage even if an erratic error phenomenon arises as mentioned above.

Another technique against the erratic error phenomenon in write operations is also disclosed in the Japanese Unexamined Patent Publication No. Hei 10(1998)-27486 (Patent Reference 2). To compare Patent Reference 1 and Patent Reference 2, the direction in which the threshold voltage varies in a write operation according to Patent Reference 1 is the same as the direction in which the threshold voltage varies in an erase operation according to Patent Reference 2, and the direction in which the threshold voltage varies in an erase operation according to Patent Reference 1 is the same as the direction in which the write threshold voltage varies according to Patent Reference 2.

This reveals that, irrespective of the varying direction of the threshold voltage, an erratic error phenomenon can occur in a write operation.

On the other hand, an operation to erase data in a flash memory is accomplished by applying an erase voltage to the control gates of memory cells in each erasion unit, and causing the FN tunnel phenomenon occurring between the channel areas and the control gates of the memory cells to pull the electric charges accumulated in the charge accumulation areas of the memory cells towards the channel areas.

Patent Reference 1: Japanese Unexamined Patent Publication No. 2002-109891 (U.S. Pat. No. 6,490,201)

Patent Reference 2: Japanese Unexamined Patent Publication No. Hei 10(1998)-27486 (U.S. Pat. No. 5,959,882)

SUMMARY OF THE INVENTION

However, the inventors have discovered that the erasion techniques for semiconductor integrated circuit devices described above involve the following problems.

To consider the electrical field occurring in each area of the memory cells in the erase operation described above, there is a problem that a particularly high electrical field arises on the insulating film between the charge storage area and the channel area, and this high electrical field gives rise to a stress in the insulating film between the charge storage area and the channel area, inviting a deterioration of the insulating film. This entails a limitation to the guaranteed number of rewrites for flash memories.

Neither of Patent References 1 nor 2 refers to the high electrical field arising in the insulating film between the charge storage area and the channel area and the resultant deterioration of the insulating film.

Or in the operation to write into memory cells, it is intended to give rise to a variation in threshold voltage only in one or more memory cells, out of the memory cells connected to one word line, into which writing is to be done, unlike in the erase operation which is intended to give rise to a threshold voltage variation in all the memory cells in the erasion unit.

Thus the control of the voltage applied to a world line in the erase operation according to the invention differs from the pulse control of the write voltage or the selection of the memory cell or cells to be written into according to Patent Reference 1 or 2 cited above.

An object of the invention is to provide a nonvolatile memory permitting an increase in the guaranteed number of rewrites for memory cells and a substantial improvement in the reliability of data reading, and a method for the erasion of data therein.

The above-stated and other objects and novel features of the present invention will become more apparent from the following detailed description when taken in conjunction with the accompanying drawings.

Typical aspects of the invention disclosed in this application will be briefly described below.

1. A nonvolatile memory according to the invention comprises: a memory array unit having a plurality of nonvolatile memory cells; a control unit; and a voltage generating unit for supplying a prescribed voltage to the nonvolatile memory cells, wherein the nonvolatile memory cells store information corresponding to the quantity of electric charges of the floating gate of each, the control unit controls write operations to store information into the nonvolatile memory cells; read operations to read information stored in the nonvolatile memory cells; and erase operations to erase information stored in the nonvolatile memory cells, the voltage generating unit has an erase voltage generating unit for generating, in accordance with control from the control unit, erase voltages to be applied to the nonvolatile memory cells in the erase operations, and the erase voltage generating unit generates, on the basis of a control signal supplied from the control unit, erase voltages of two or more levels and apples them to the control gates of the nonvolatile memory cells.

Other inventions covered by the application will be summarized below.

2. A nonvolatile memory comprises: a memory array unit having a plurality of nonvolatile memory cells; a control unit; and a voltage generating unit for supplying a prescribed voltage to the nonvolatile memory cells, wherein the nonvolatile memory cells store information corresponding to the quantity of electric charges of the floating gate of each, the control unit controls write operations to store information into the nonvolatile memory cells; read operations to read information stored in the nonvolatile memory cells; and erase operations to erase information stored in the nonvolatile memory cells, the voltage generating unit has an erase voltage generating unit for generating, in accordance with control from the control unit, erase voltages to be applied to the nonvolatile memory cells in the erase operations, and the erase voltage generating unit generates, on the basis of a control signal supplied from the control unit, erase voltages of two or more levels to make the voltages applied to the tunnel films of the nonvolatile memory cells substantially constant and applying them to the control gates of the nonvolatile memory cells.

3. By a data erasing method for a nonvolatile memory according to the invention, an operation to erase data in the nonvolatile memory cells is performed by applying an erase voltage, while being switched between two or more different levels, to the control gate of each nonvolatile memory cell, and no erase verification is performed in the erase operation until the erase voltage of two or more levels is applied to all the cells.

4. By a data erasing method for a nonvolatile memory according to the invention, erase voltages of two or more levels to make the voltages applied to the tunnel films of the nonvolatile memory cells substantially constant are applied, while being switched between two or more different levels, to the control gate of each of the nonvolatile memory cells to erase data in the nonvolatile memory cells, and no erase verification is performed in the erase operation until the erase voltage of two or more levels is applied to all the cells.

BRIEF DESCRIPTION OF THE DRAWINGS

FIG. 21 shows test data of comparison of retention characteristics in a state of being let stand at high temperature between erasion of data in the memory cell studied by the present inventors for comparison and erasion of data in the memory cell with a bisected soft erase voltage in this embodiment of the invention.

DETAILED DESCRIPTION OF THE PREFERRED EMBODIMENT

One preferred embodiment of the present invention will be described in detail below with reference to the accompanying drawings.

Figure 1:
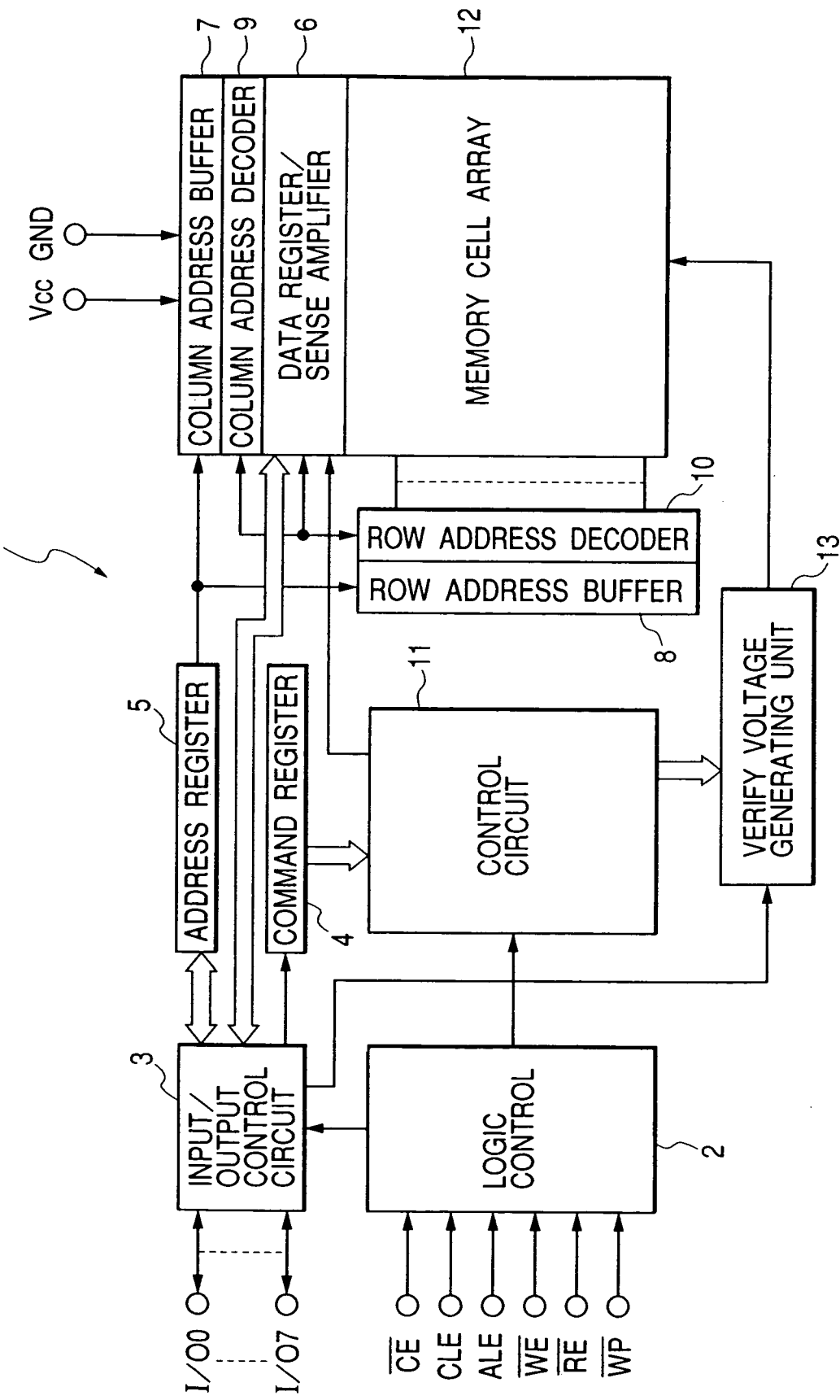
FIG. 1 is a block diagram of a flash memory, which is a preferred embodiment of the invention.
Figure 2:
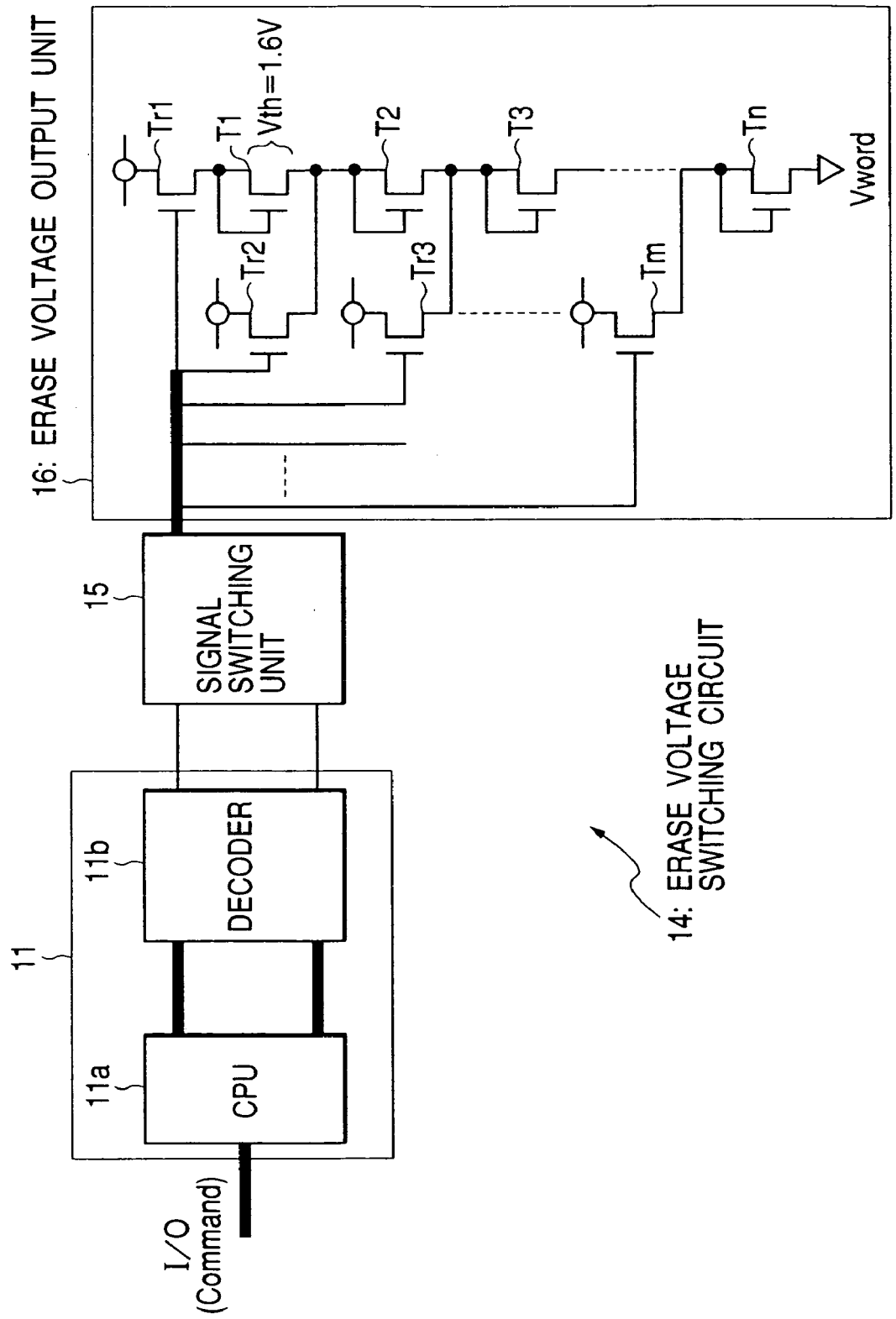
FIG. 2 illustrates the configuration of an erase voltage switching circuit provided in the flash memory of FIG. 1.
Figure 3:
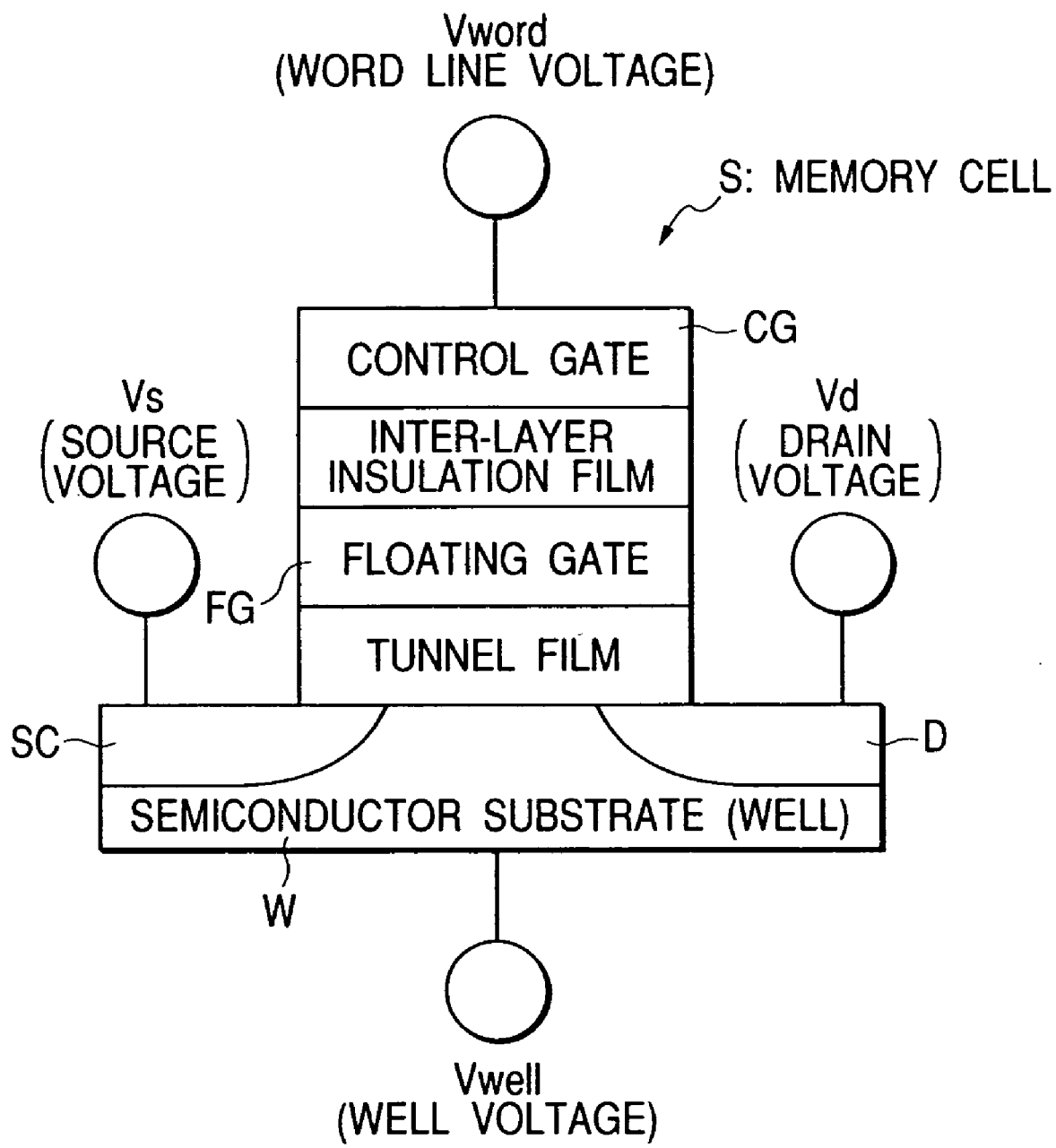
FIG. 3 illustrates the configuration of a memory cell provided in the flash memory of FIG. 1.
Figure 5:
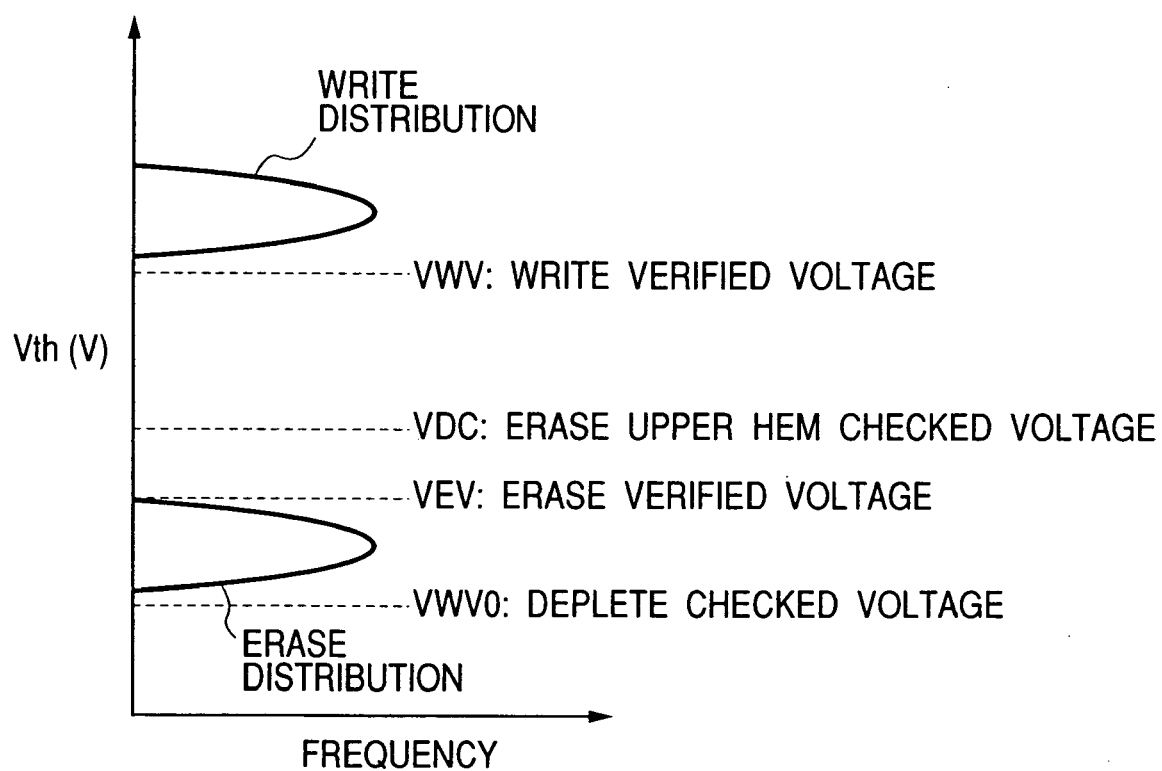
FIG. 5 illustrates the erase distribution in the memory cell of FIG. 3.
Figure 6:
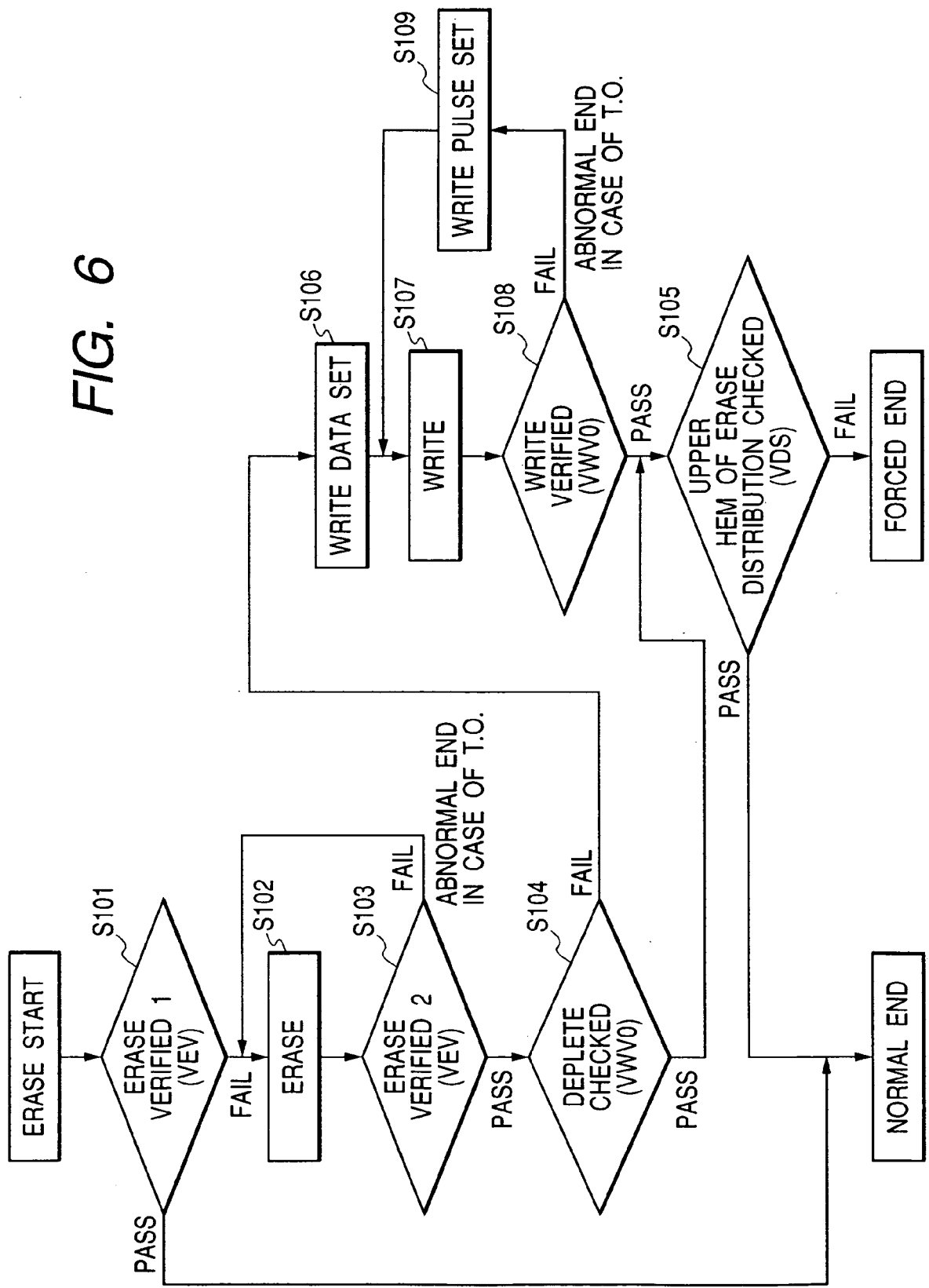
FIG. 6 is a flow chart of the erasion sequence of memory cells in the flash memory of FIG. 1.
Figure 7:
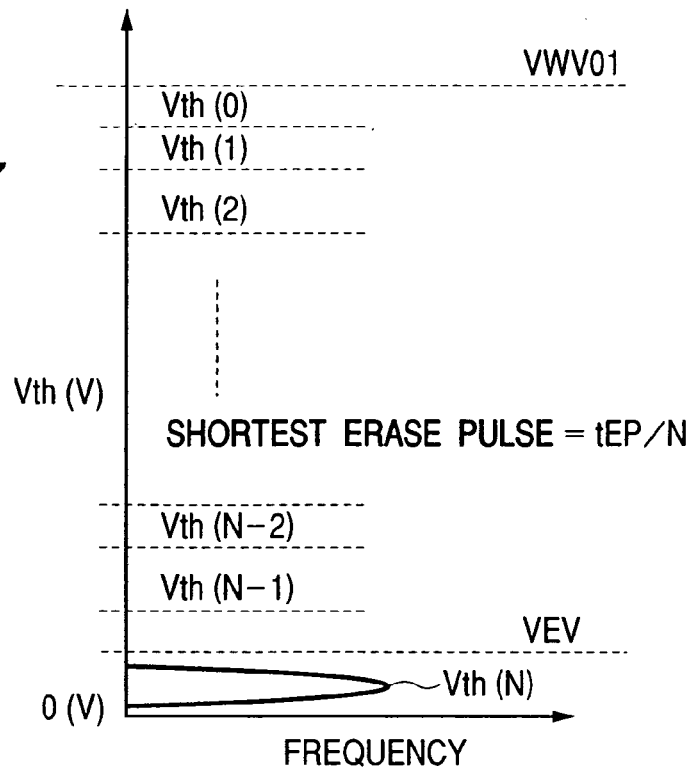
FIG. 7 illustrates one example of soft erase voltage setting in the erase operation for the memory cell of FIG. 3.
Figure 8:
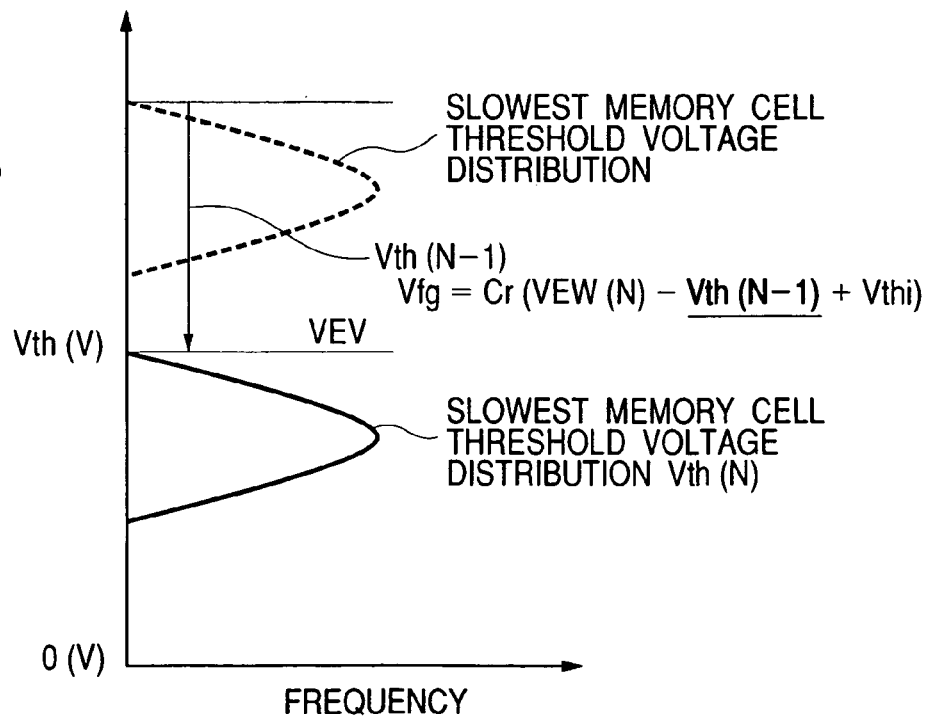
FIG. 8 illustrates one example of soft erase voltage setting following FIG. 7.
Figure 9:
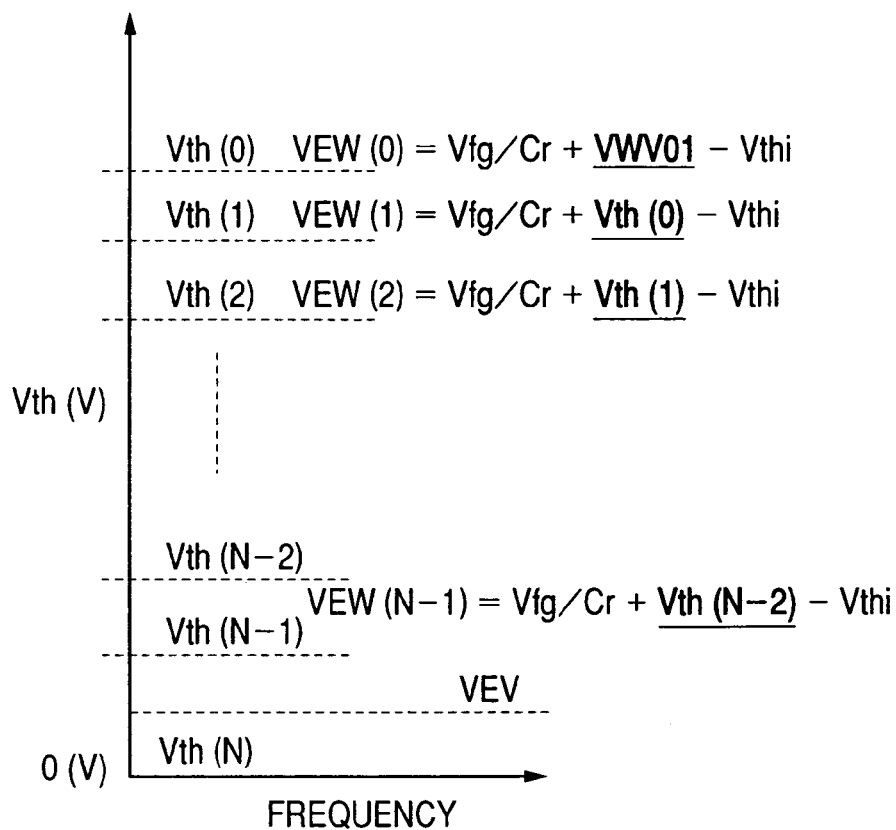
FIG. 9 illustrates one example of soft erase voltage setting following FIG. 8.
Figure 14:
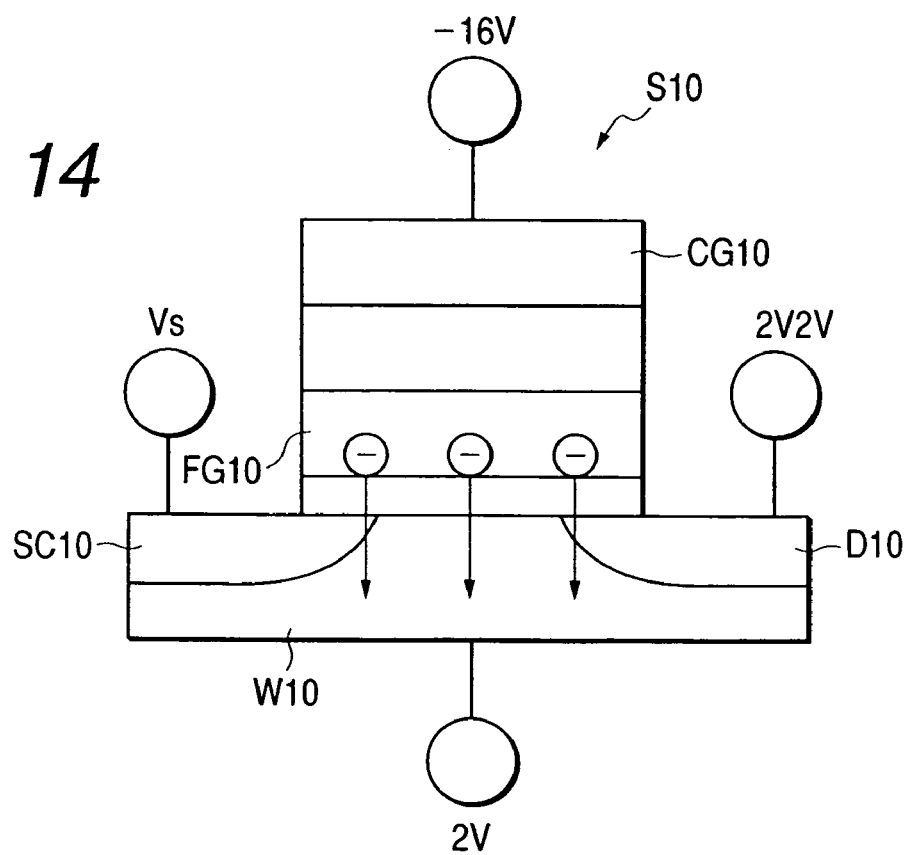
FIG. 14 illustrates the relationship among voltages at the time of erasing data in a memory cell studied by the present inventors as a comparative example.
Figure 15:
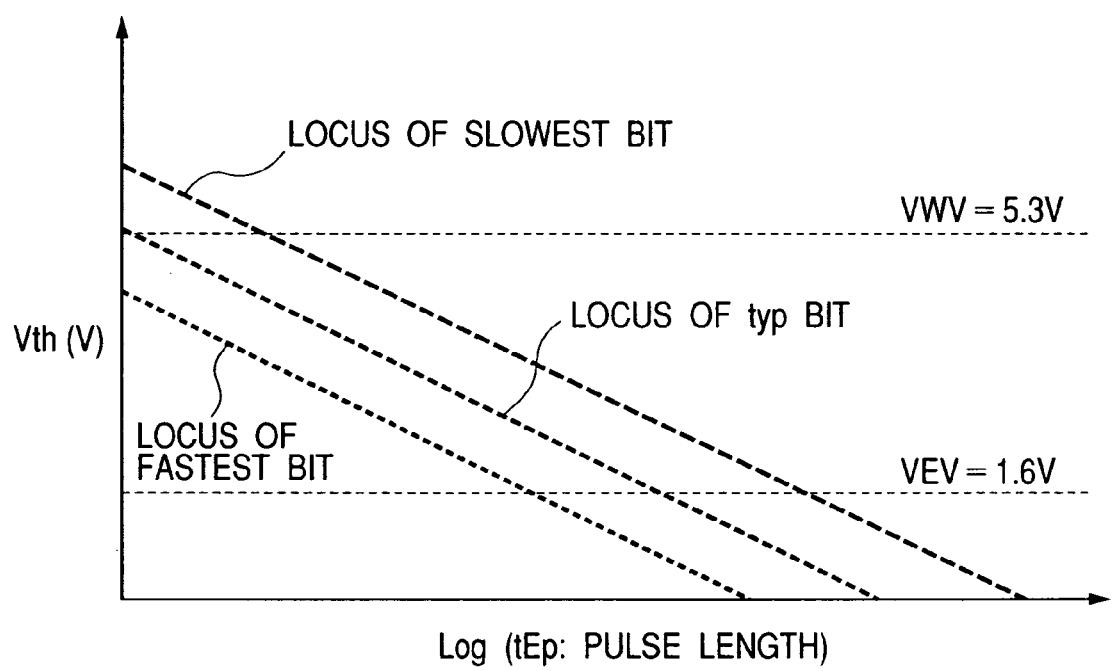
FIG. 15 illustrates the erasion characteristics of the memory cell of FIG. 14 including fluctuations.
Figure 16:
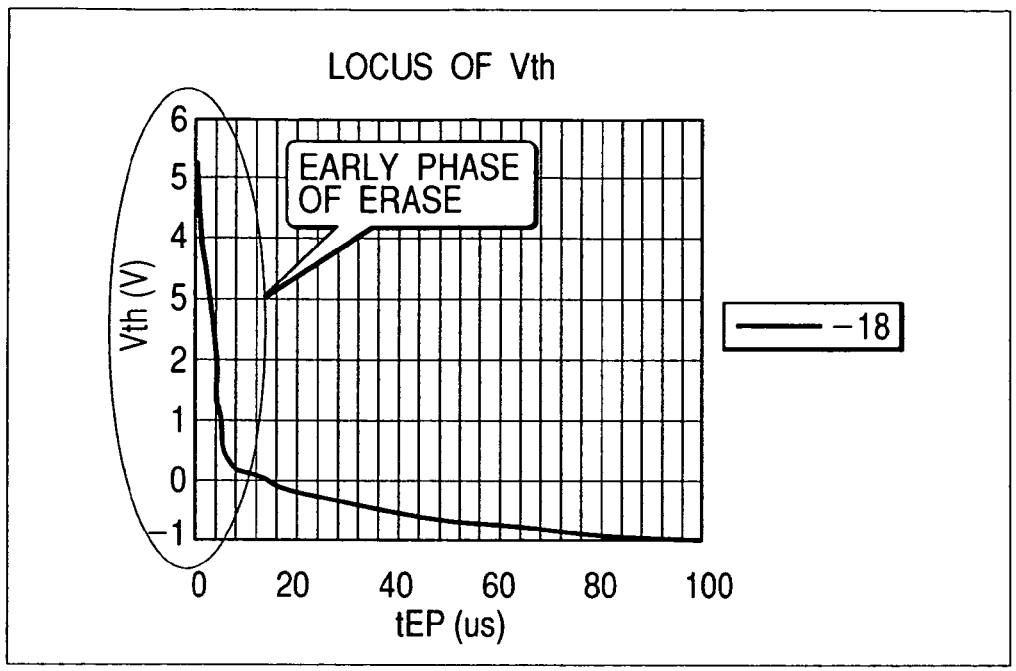
FIG. 16 illustrates the threshold voltage in the memory cell of FIG. 14.
Figure 17:
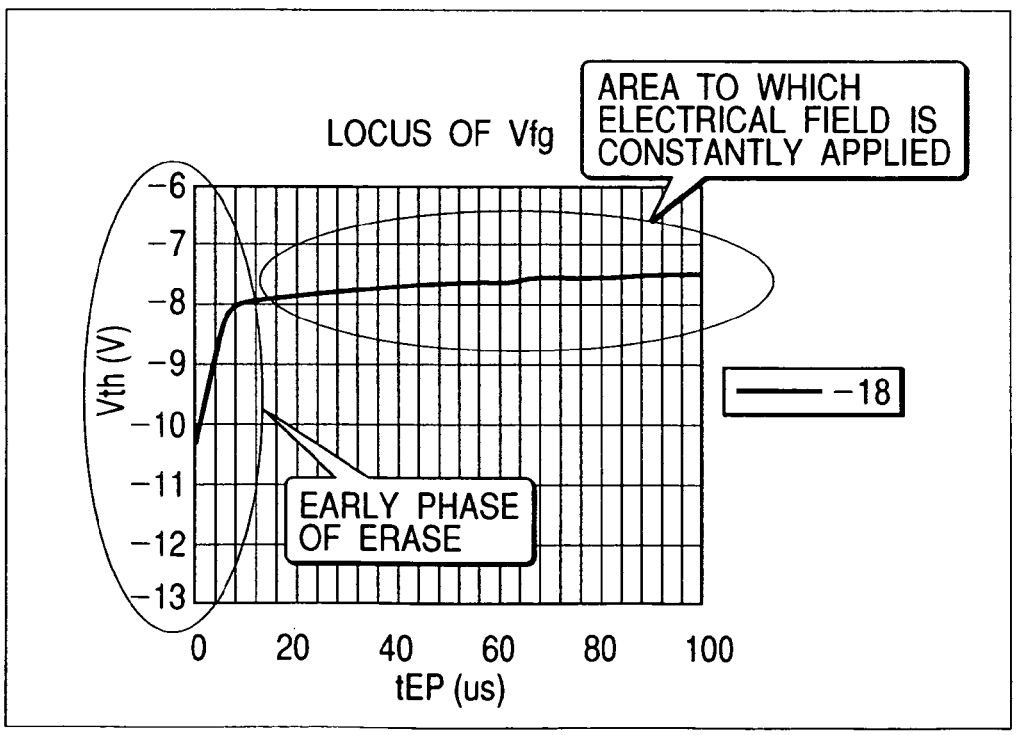
FIG. 17 illustrates the floating gate voltage at the time of erasion in the memory cell of FIG. 14.
Figure 18:
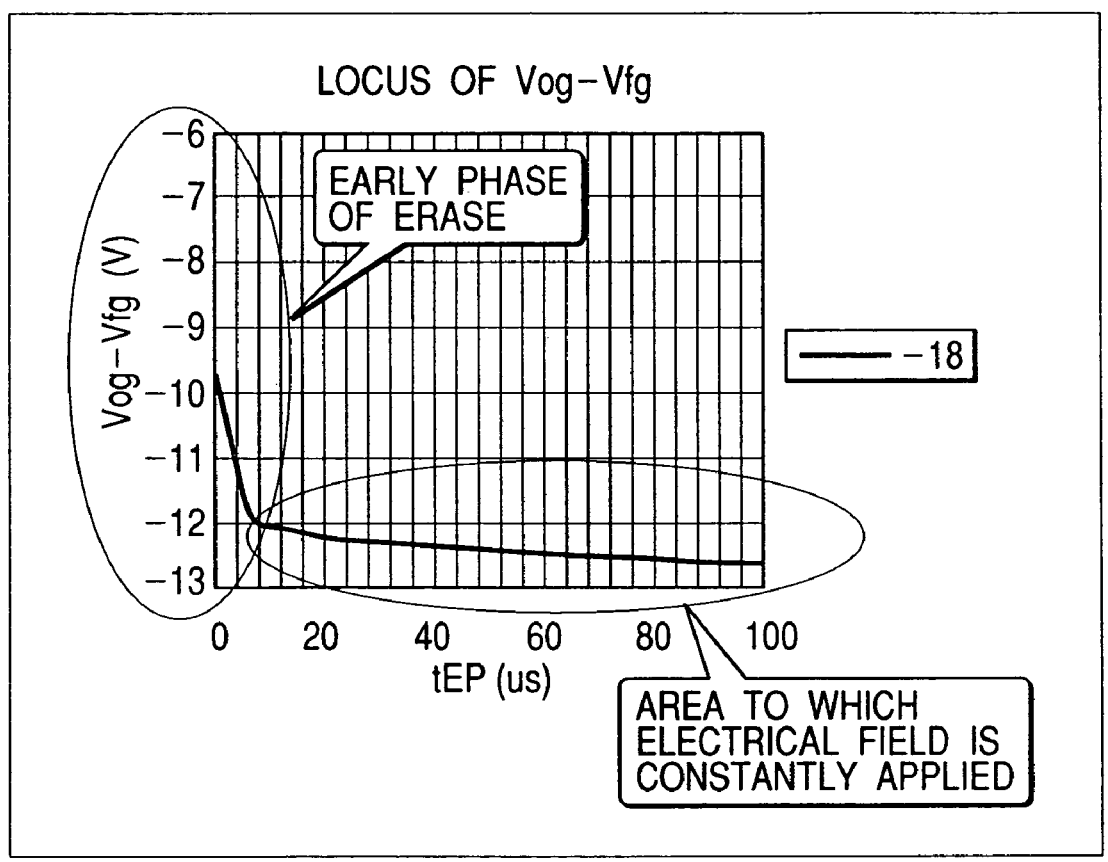
FIG. 18 illustrates the voltage between the control gate and the floating gate of the memory cell of FIG. 14.
Figure 19:
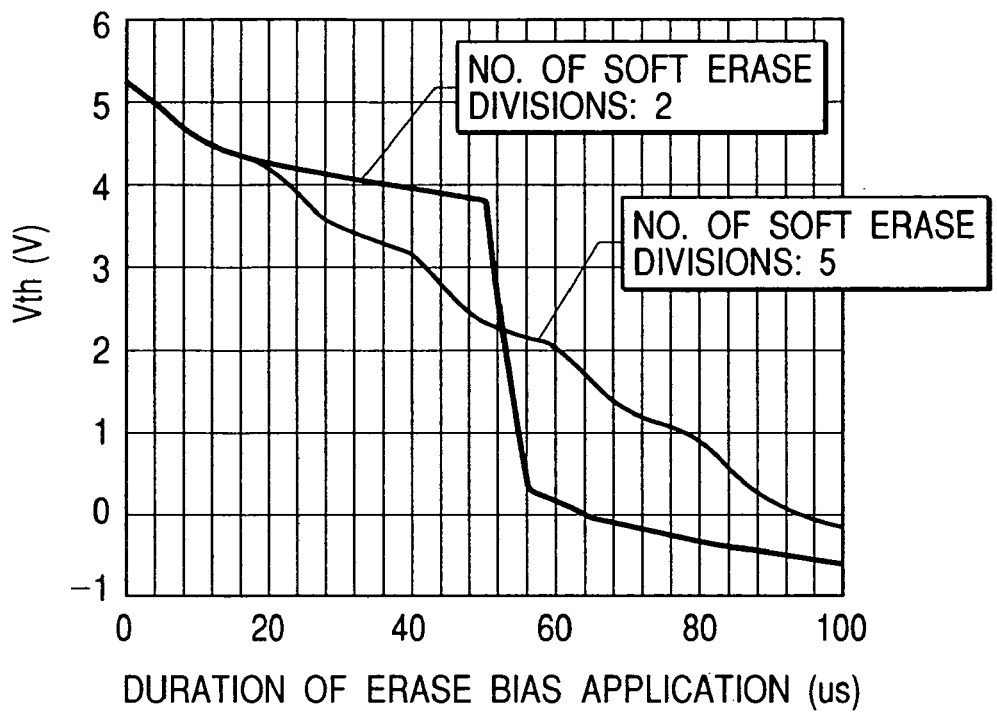
FIG. 19 illustrates comparison of the loci of the threshold voltage of a memory cell wherein the soft erase voltage is divided by different numbers in the embodiment of the invention.
Figure 20:
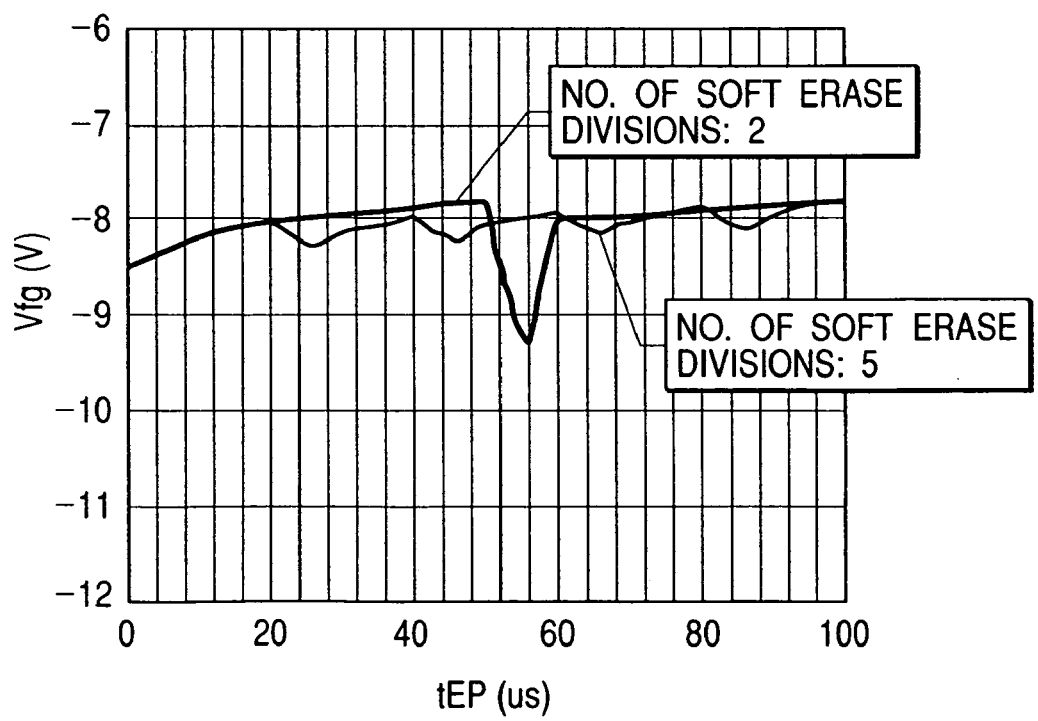
FIG. 20 illustrates comparison of the loci of the floating gate voltage of a memory cell wherein the soft erase voltage is divided by different numbers at the time of erasion in the embodiment of the invention.

FIG. 1 is a block diagram of a flash memory, which is the preferred embodiment of the invention; FIG. 2 illustrates the configuration of an erase voltage switching circuit provided in the flash memory of FIG. 1; FIG. 3 illustrates the configuration of a memory cell provided in the flash memory of FIG. 1; FIG. 4 illustrate the relationship among voltages applied to different films in the memory cell of FIG. 3; FIG. 5 illustrates the erase distribution in the memory cell of FIG. 3; FIG. 6 is a flow chart of the erasion sequence of memory cells in the flash memory of FIG. 1; FIG. 7 through FIG. 9 illustrate one example of soft erase voltage setting in the erase operation for the memory cell of FIG. 3; FIG. 10 through FIG. 13 illustrate another example of soft erase voltage setting in the erase operation for the memory cell of FIG. 3; FIG. 14 illustrates the relationship among voltages at the time of erasing data in a memory cell studied by the present inventors as a comparative example; FIG. 15 illustrates the erasion characteristics of the memory cell of FIG. 14 including fluctuations; FIG. 16 illustrates the threshold voltage in the memory cell of FIG. 14; FIG. 17 illustrates the floating gate voltage at the time of erasion in the memory cell of FIG. 14; FIG. 18 illustrates the voltage between the control gate and the floating gate of the memory cell of FIG. 14; FIG. 19 illustrates comparison of the loci of the threshold voltage of a memory cell wherein the soft erase voltage is divided by different numbers in the embodiment of the invention; FIG. 20 illustrates comparison of the loci of the floating gate voltage of a memory cell wherein the soft erase voltage is divided by different numbers at the time of erasion in the embodiment of the invention; and FIG. 21 shows test data of comparison of retention characteristics in a state of being let stand at high temperature between erasion of data in the memory cell studied by the present inventors for comparison and erasion of data in the memory cell with a bisected soft erase voltage in this embodiment of the invention.

In this embodiment of the invention, a flash memory (nonvolatile memory) 1 is provided with a logic control 2 and an input/output control circuit 3 as shown in FIG. 1.

The logic control 2 temporarily stores control signals from the host to be connected to, such as a microcomputer, and controls the operational logic. The input/output control circuit 3, into which are entered various signals including commands, external addresses and program data entered into and supplied from the host, supplies the commands, external addresses and data to a command register 4, an address register 5 and a data register/sense amplifier 6, respectively on the basis of the control signals.

To the address register 5 are connected a column address buffer 7 and a row address buffer 8. These column address buffer 7 and row address buffer 8 temporarily store addresses supplied from the address register 5.

To the column address buffer 7 is connected a column address decoder 9, and to the row address buffer 8 is connected a row address decoder 10. The column address decoder 9 performs decoding on the basis of column addresses supplied from the column address buffer 7, and the row address decoder 10 performs decoding on the basis of row addresses supplied from the row address buffer 8.

To the logic control 2 and the command register 4 is connected a control circuit (control unit) 11, and the data register/sense amplifier 6 is controlled by this control circuit 11.

To the data register/sense amplifier 6 and the row address decoder 10 is connected a memory cell array 12 which permits electrical erasion of data and requires no power source for the storage of data.

Nonvolatile memory cells S (FIG. 3), which are the smallest units of memory, are regularly arranged in the memory cell array 12 in an array form. Writing data into or erasing data in these memory cells S provided in the memory cell array 12, for instance, is accomplished by letting a tunnel current flow all over the channel areas of the memory cells S and performing discharges and charges at their floating gates.

To the input/output control circuit 3 is connected a verify voltage generating unit (voltage generating unit) 13. This verify voltage generating unit 13 generates a verify voltage for use in verify operations, and controls the voltage to supply it to the memory cell array 12.

Further, the verify voltage generating unit 13 is provided with an erase voltage switching circuit (erase voltage generating unit) 14. The erase voltage switching circuit 14 consists of a signal switching unit 15 and an erase voltage output unit 16 as shown in FIG. 2.

The signal switching unit 15 supplies a control signal on the basis of a decode signal. The decode signal is generated by a CPU 11a and a decoder 11b provided in the control circuit 11. A command entered via an I/O port is entered into the CPU 11a, and the CPU 11a supplies a command signal to the decoder 11b. This signal is decoded by the decoder 11b and supplied to the signal switching unit 15.

The erase voltage output unit 16 outputs any desired erase voltage on the basis of the control signal from the signal switching unit 15, and supplies it as the word line potential.

The erase voltage output unit 16 is configured of transistors T1 through Tn and Tr1 through Trn. The transistors T1 through Tn are diode-connected, and these transistors T1 through Tn are connected in series between a boosted voltage generated by the verify voltage generating unit 13 and a word line.

The connection is such that the boosted voltage generated by the verify voltage generating unit 13 be supplied to one of the connections of each of the transistors Tr1 through Trn. To the other connection of the transistor Tr1 is connected one of the connections of the transistor T1, and to the other of the connections of each of the transistors Tr2 through Trn is connected one of the connections of each of the transistors T2 through Tn.

The connection is such that the control signal supplied from the signal switching unit 15 be entered into the gate of each of the transistors Tr1 through Trn.

By having any desired one of the transistors Tr1 through Trn selected according to the control signal from the signal switching unit 15 selected and turned on, an erase voltage of a boosted voltage—(1.6 V×the number of stages of the transistors T1 through Tn) is supplied.

The configuration of the memory cells S provided in the memory cell array 12 will now be described with reference to FIG. 3.

Each of the memory cells S is configured in a stacked structure which has a diffusion layer consisting of, for instance, a source SC and a drain D and in which a floating gate FG is formed over a semiconductor substrate W between those source SC and drain D via a tunnel film, and a control gate CG is formed above the floating gate FG via an inter-layer insulation film.

A word line voltage Vword is applied to the control gate CG of the memory cell S, wherein information is stored by holding electric charges within the floating gate FG surrounded by a high energy barrier.

Here will be explained the relationship among voltages applied to different films of the memory cell S.

Figure 4A:
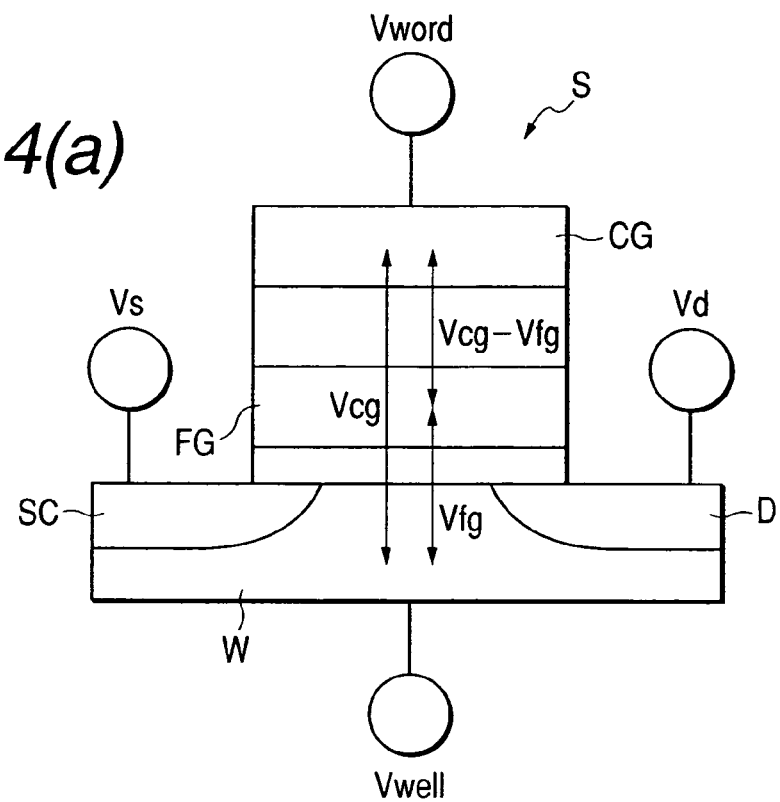
FIG. 4 illustrate the relationship among voltages applied to different films in the memory cell of FIG. 3.

As shown in FIG. 4(a), with the voltage applied to the tunnel film being represented by Vfg and that applied to the semiconductor substrate W/control gate CG, by Vcg, the voltage between the floating gate FG and the control gate CG is Vcg−Vfg.

Figure 4B:
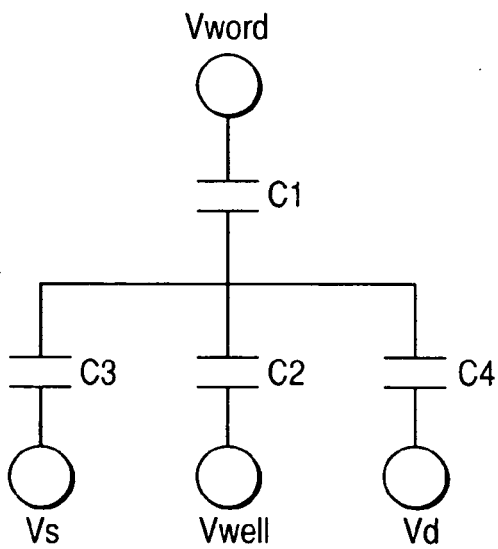

Therefore, as shown in FIG. 4(b), the electrical field (Vfg) working on the tunnel film and the electrical field (Vcg−Vfg) working on the inter-layer insulation film are expressed in the quantity of electric charges held by the floating gate FG and the capacitive coupling among the potentials surrounding the floating gate FG.

The erase distribution of the memory cell S, as shown in FIG. 5, is accommodated in the range from the deplete (so-called excess erasion) checked level (deplete checked voltage VWV0 to +1 V) to the erasion verified level (erasion verify voltage VEV to 1.6 V).

The erasion sequence for the memory cell S of the erase distribution shown in FIG. 5 will be described with reference to the flow chart of FIG. 6.

First, as the erase operation starts, the first erase verification is performed (step S101). Then, if the memory cell S is found to have undergone erasion, the sequence will normally end. Or if the memory cell S is found not to have undergone erasion, the memory cell S will undergo erasion (step S102).

In this processing at this step S102, voltages consisting of any desired different voltage levels (for instance eight voltage levels), while being switched from one to another, are applied to the control gate CG of the memory cell S as control gate voltages Vcg (=soft erase voltages (erase voltages) VEW(0) through VEW(N)).

Switching of the erase voltage is done according to the quantity of electric charges accumulated at the floating gate FG of the memory cell S to keep substantially constant the voltage applied to the tunnel film of the memory cell S.

When an erase command is accepted via an I/O pin, the CPU 11a (FIG. 2) outputs a control signal to the decoder 11b (FIG. 2), and the erase voltage switching circuit 14 (FIG. 2) generates a soft erase voltage VEW(0) of a certain level on the basis of that decode signal, and supplies it to a word line. After that, switching is successively done from one to another of soft erase voltages VEW(1) through VEW(N) differing in level, which are applied to the control gate CG of the memory cell S to erase data therein.

Upon completion of erasion for the memory cell S, the erasion is again verified (step S103) and, if the memory cell S is found to have undergone erasion, a deplete check is performed (step S104).

If the memory cell S is found not to have undergone erasion, processing at steps S102 and S103 is repeated until data in the memory cell S are erased. The second or subsequent processing at step S102 can be, for instance, application of only the last applied soft erase voltage VEW (N) in a varied duration, or application of gradually varied voltages, switched from one to next beginning with a voltage about equal to the soft erase voltage VEW(N) and eventually rising to one higher than the soft erase voltage VEW(N).

If the deplete check at step S104 is found normal, the upper hem of the erase distribution is checked (step S105) and, if it is found normal, the processing is ended. If the deplete check is found abnormal, write data are set (step S106), and data are written again into the memory cells S (step S107), followed by write verification (step S108).

If the write verification at step S108 is found normal, processing at step S105 is done, leading to normal ending if it is normal or, if it is abnormal, the process comes to a forced end. If the write verification at step S108 is found abnormal, a write pulse is set again (step S109). The processing at steps S107 and S109 is repeated until the write verification at step S108 becomes normal.

Next will be explained the technique to set the soft erase voltages VEW(0) through VEW(N) in the erase operation for the memory cell S shown at step S102 of FIG. 6.

First will be described a sequence of erasing the bit taking the longest erase time (=tEP) (the bit slowest in memory erasion characteristic) at tEP/N (=100 μs/N) with reference to FIG. 7 through FIG. 9. In these FIG. 7 through FIG. 9, the vertical axis represents the threshold voltage Vth of the memory cell S and the horizontal axis, the frequency.

First, as shown in FIG. 7, the amplitude (=VWV−VEV=ΔVth) and the erase time tEP(=100 μs) of the threshold voltage Vth distribution of the memory cell S is divided by N, and multiple threshold voltages Vth are determined from the highest downward, i.e. from a threshold voltage Vth(0)(=deplete checked voltage VWV−ΔVth/N), a threshold voltage Vth(1)=Vth0−ΔVth/N to a threshold voltage Vth(N−1)=Vth(N−1)−ΔVth/N. The minimum applicable pulse width (tEP/N) is also determined.

Then as shown in FIG. 8, a control gate voltage Vcg(=soft erase voltage VEW(N)) that can erase the threshold voltage Vth(N−1) of the slowest bit that comes (N−1)th to the threshold voltage Vth(N) in a time of tEP/N is set, and the floating gate voltage Vfg at the time is computed.

In this way, as shown in FIG. 9, the levels of the multiple threshold voltages Vth(0) through Vth(N−1) (=soft erase voltages VEW(1) through VEW(N−1)) can be so set as to keep the floating gate voltage Vfg constant.

Next will be explained the technique to set the soft erase voltages VEW(0) through VEW(N) for erasing, after erasing the typ (typical) bits of the erase time in the erase time tEP/2(=50 μs) by a divisor (N−1), the remaining bits until the slowest one in the erase time tEP/2(=50 μs) with reference to FIG. 10 through FIG. 13. In these FIG. 10 through FIG. 13, too, the vertical axis represents the threshold voltage Vth of the memory cell S and the horizontal axis, the frequency.

Figure 10:
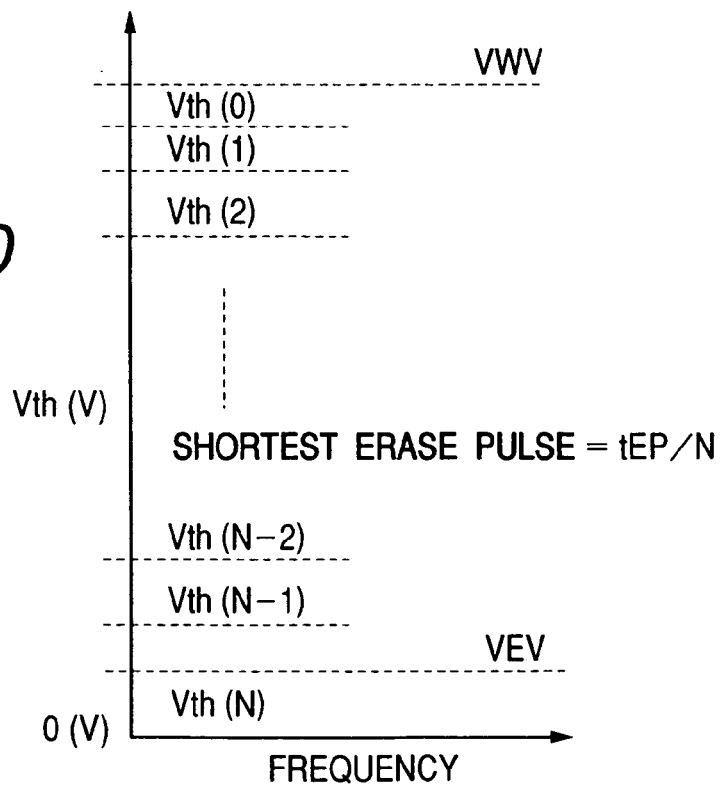
FIG. 10 illustrates another example of soft erase voltage setting in the erase operation for the memory cell of FIG. 3.

First, as shown in FIG. 10, the amplitude of the threshold voltage Vth distribution (=VWV−VEV=ΔVth) and the erase time tEP are divided by N, and multiple threshold voltages Vth are determined from the highest downward, i.e. from the threshold voltage Vth(0) (=VWV−ΔVth/N), then the threshold voltage Vth(1)=Vth(0)−ΔVth/N until the threshold voltage Vth(N−1)=Vth(N−1)−ΔVth/N. The minimum applicable pulse width (tEP/2/(N−1)) is also determined.

Figure 11:
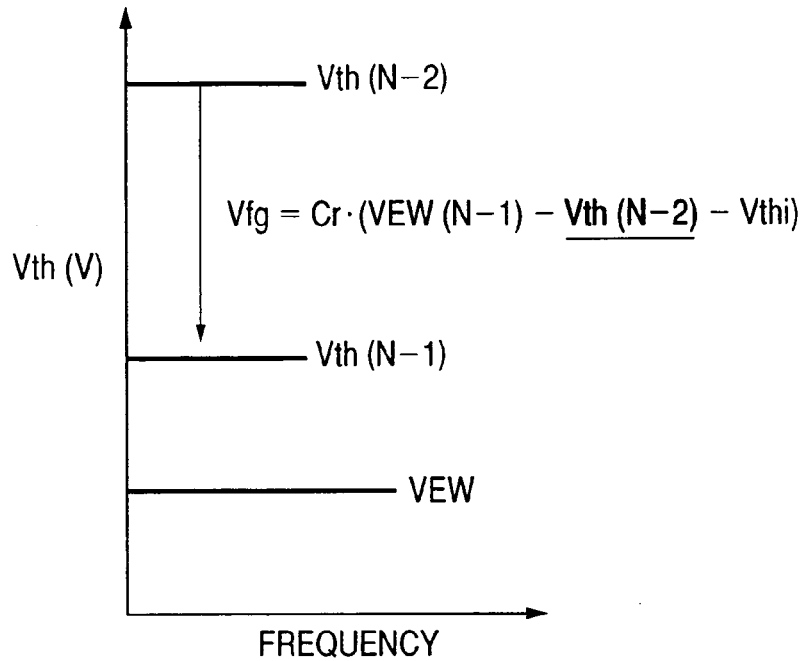
FIG. 11 illustrates another example of soft erase voltage setting following FIG. 10.

As shown in FIG. 11, a control gate voltage Vcg with which the threshold voltage Vth(N−2) of the typ bit that comes (N−2)th can be erased to the threshold voltage Vth(N−1) in the erase time tEP/2/(N−1) is set. On this occasion, the floating gate voltage Vfg is computed.

Figure 12:
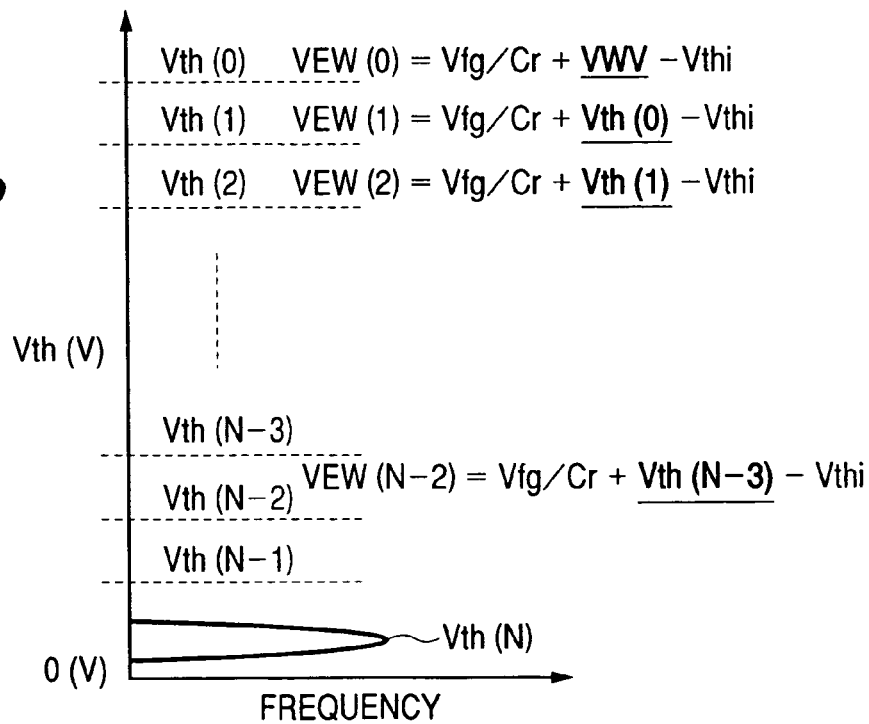
FIG. 12 illustrates another example of soft erase voltage setting following FIG. 11.
Figure 13:
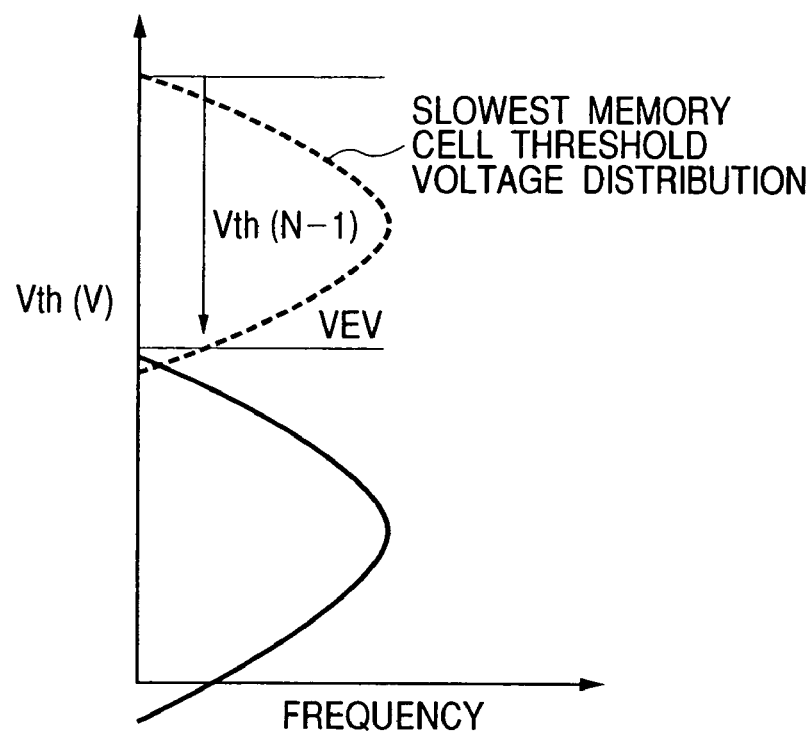
FIG. 13 illustrates another example of soft erase voltage setting following FIG. 12.

Then, as shown in FIG. 12, the control gate voltage Vcg of each of the threshold voltages Vth(0) through (N−2) (=soft erase voltage VEW(1) through VEW(N−2)) are so set as to keep the floating gate voltage Vfg constant and, as shown in FIG. 13, a control gate voltage Vcg that can erase the slowest bit in tEP/2 (=50 μs) is set.

Next will be explained a method of erasing data in a memory cell S10 studied by the present inventors as a comparative example with reference to FIG. 14 through FIG. 18.

FIG. 14 illustrates the relationship among voltages at the time of erasing data in the memory cell S10. The memory cell S10, like the memory cell S (FIG. 3), has a configuration in which there is a diffusion layer consisting of, for instance, a source SC10 and a drain D10, a floating gate FG10 is formed over a semiconductor substrate W10 between those source SC10 and drain D10 via a tunnel film, and a control gate CG10 is formed above the floating gate FG10 via an inter-layer insulation film.

In carrying out erasion, electrons in the floating gate FG10 are discharged via the tunnel film by applying a negative voltage (of about −16 V at the maximum) to the control gate CG10 and a positive voltage (about 0 V to about 2 V) to the semiconductor substrate W10.

FIG. 15 illustrates the erasion characteristics of the memory cell S10 of FIG. 14 including fluctuations. In FIG. 15, the vertical axis represents the threshold voltage Vth (V) of the memory cell S10 and the horizontal axis, the erase time tEP.

In this case, the control gate voltage Vcg is about −16 V, and the substrate voltage Vwell is about 2 V. Erasion and verification are repeated until the slowest bit in memory erase characteristic passes the erase verify.

Therefore, as illustrated, the previous practice was to apply a long pulse to perform erase operations in order to prevent the erase time from being increased by a greater number of verify operations. For instance, where a pulse of 100 μs in erase time tEP requires verification only once.

Further, FIG. 16 through FIG. 18 illustrate the loci of the memory threshold voltage in the typ bit memory cell, the tunnel film and the loci of the electrical field sensed by the inter-layer insulation film.

Until the threshold voltage verify level of the erase time tEP (up to 20 µs) shown in FIG. 16 is passed, high electrical fields work on the tunnel film and inter-layer insulation film as shown in FIG. 17 and FIG. 18, and after that the electrical fields continue to work constantly until the slowest bit passes through the erase verification (tEP to 100 µs).

This may inflict damages to the tunnel film and the inter-layer insulation film of the memory cell S10, inviting a drop in the threshold voltage of the data written therein and consequent faulty reading.

FIG. 19 and FIG. 20 illustrate the loci of the threshold voltage of the typ bite memory cell, the tunnel film and the loci of the electrical field sensed by the inter-layer insulation film wherein the soft erase voltage VEW according to the invention is divided into two voltage levels or eight voltage levels and applied for erasion.

As shown in FIG. 19, the electrical field of the inter-layer insulation film can be alleviated because this electrical field is alleviated until the threshold voltage in the early phase of erasion (tEP to 20 µs) passes the verify level and after that the electrical field continues to work constantly until the slowest bit passes through the erase verification (tEP to 100 µs).

Further as shown in FIG. 20, in the case of the division of the soft erase voltage VEW by eight, the floating gate voltage Vfg of the memory cell S can be made more stably constant than where the soft erase voltage VEW is divided by two, and can alleviate the electrical field of the inter-layer insulation film more significantly.

FIG. 21 shows test data of comparison of retention characteristics in a state of being let stand at high temperature between erasion of data in the memory cell S10 studied by the present inventors and erasion of data in the memory cell S with the bisected soft erase voltage VEW according to the invention.

As illustrated, the erasion system for the memory cells S according to the invention can store data for 100,000 hours even after their rewriting 300,000 times, resulting in a significant increase in the guaranteed number of rewrites for the flash memory 1.

Accordingly, since this embodiment of the invention permits easing of the electrical fields inflicted on the tunnel film and the inter-layer insulation film of the memory cell S by the erase operation, an increase in the guaranteed number of rewrites for memory cell S is made possible, resulting in the prevention of faults in data reading and improvement in the reliability of the flash memory 1.

While the foregoing description specifically concerned the invention achieved by the present inventors with reference to a preferred embodiment thereof, the invention obviously is not limited to what has been described above, but can be extensively utilized without deviating from its essentials. Thus, in a write operation, a technique described of the prior art can be used by varying twice or more the level of the write voltage to be applied to the word line, to which the memory cell to be written, and varying the pulse width of the write voltage.

Advantages achieved by the invention disclosed in this application in its typical aspects will be briefly described below.

(1) During an erase operation, stresses working in nonvolatile memory cells can be substantially reduced.

(2) The feature stated in (1) above contributes to enhancing the reliability of the nonvolatile memory.

What is claimed is:

1. A nonvolatile memory comprising:
a memory array unit having a plurality of nonvolatile memory cells;
a control unit; and
a voltage generating unit for supplying voltages to said nonvolatile memory cells,
wherein each nonvolatile memory cell is capable of storing information as a threshold voltage thereof within an arbitrary one of voltage ranges corresponding to information,
wherein the control unit is capable of performing an arbitrary one of a write operation to store information into the nonvolatile memory cell, a read operation to read information stored in the nonvolatile memory cell, an erase operation to erase information stored in the nonvolatile memory cell, and a verify operation to check whether the threshold voltage is within a voltage range corresponding to information in the write operation or a voltage range corresponding to an erase state in the erase operation,
wherein the voltage generating unit has an erase voltage generating unit for generating an arbitrary one of erase voltages to be supplied to the nonvolatile memory cell in the erase operation,
wherein one of the erase voltages has a first voltage level and another of the erase voltages has a second voltage level higher than the first voltage level,
wherein in the erase operation, the control unit performs control to supply the one erase voltage of the first voltage level and then to supply the other erase voltage of the second voltage level to the nonvolatile memory cell, and
wherein the control unit does not perform the verify operation during the supply of the one erase voltage to the nonvolatile memory cell, and performs the verify operation after the supply of the other erase voltage to the nonvolatile memory cell.

2. A nonvolatile memory according to claim 1,
wherein the control unit repeats the erase operation to supply the other erase voltage to the nonvolatile memory cell when the threshold voltage of the nonvolatile memory cell is not within the voltage range corresponding to the erase state in the verify operation.

3. A nonvolatile memory according to claim 2,
wherein each nonvolatile memory cell has a channel region, an electric charge region above the channel region, and control terminal above the electric charge region,
wherein before the erase operation is performed, the nonvolatile memory cell is capable of charging electrons into the electric charge region,
wherein a voltage difference between the channel region and the electric charge region before the supply of erase voltages to the nonvolatile memory cell is higher than a voltage difference between the channel region and the electric charge region after the erase voltages have been supplied to the nonvolatile memory cell.

4. A nonvolatile memory according to claim 3,
wherein the threshold voltages of all of the nonvolatile memory cells are in the voltage range corresponding to the erase state after performance of the erase operation.

* * * * *